(12) United States Patent
Nakao et al.

(10) Patent No.: US 9,425,147 B2
(45) Date of Patent: Aug. 23, 2016

(54) SEMICONDUCTOR DEVICE

(75) Inventors: Yuichi Nakao, Kyoto (JP); Tadao Ohta, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 887 days.

(21) Appl. No.: 13/634,212

(22) PCT Filed: Apr. 1, 2011

(86) PCT No.: PCT/JP2011/058400
§ 371 (c)(1),
(2), (4) Date: Sep. 11, 2012

(87) PCT Pub. No.: WO2011/125928
PCT Pub. Date: Oct. 13, 2011

(65) Prior Publication Data
US 2013/0001785 A1    Jan. 3, 2013

(30) Foreign Application Priority Data

Apr. 1, 2010    (JP) ................................ 2010-085193

(51) Int. Cl.
*H01L 23/52* (2006.01)
*H01L 21/768* (2006.01)
(Continued)

(52) U.S. Cl.
CPC ... *H01L 23/53295* (2013.01); *H01L 21/76832* (2013.01); *H01L 21/76834* (2013.01);
(Continued)

(58) Field of Classification Search
CPC .................. H01L 23/5283; H01L 23/53295; H01L 24/05; H01L 24/06; H01L 24/07; H01L 24/08; H01L 24/09
See application file for complete search history.

(56) References Cited

U.S. PATENT DOCUMENTS 6,060,378 A * 5/2000 Rolfson .................. H01L 24/05
                                                         257/E23.02
6,376,911 B1    4/2002 Ryan et al.
(Continued)

FOREIGN PATENT DOCUMENTS

JP    05-144811 A    6/1993
JP    06-089893 A    3/1994
(Continued)

OTHER PUBLICATIONS

Efland et al, "Lead Frame on Chip Offers Integrated Power Bus and Bond over Active Circuit," Proceedings of 2001 International Symposium on Power Semiconductor Devices & ICs, Osaka, pp. 65-68. 2001.

*Primary Examiner* — Mark Tornow
*Assistant Examiner* — Abbigale Boyle
(74) *Attorney, Agent, or Firm* — Rabin & Berdo, P.C.

(57) ABSTRACT

A semiconductor device includes an interlayer insulating film; a wiring formed on the interlayer insulating film so as to protrude there from and made of a material having copper as a main component, the wiring having a thickness direction and having a cross sectional shape of an inverted trapezoid that becomes wider in width with distance away from the interlayer insulating film; and a passivation film formed so as to cover the wiring. The passivation film is made of a laminated film in which a first nitride film, an intermediate film, and a second nitride film are laminated in that order from the wiring side. The intermediate film is made of an insulating material differing from those of the first and second nitride films, and has a tapered portion having a cross sectional shape of a trapezoid that becomes narrower in width with distance away from the interlayer insulating film.

8 Claims, 17 Drawing Sheets

(51) Int. Cl.
*H01L 23/532* (2006.01)
*H01L 23/528* (2006.01)
*H01L 23/31* (2006.01)
*H01L 23/00* (2006.01)

(52) U.S. Cl.
CPC ....... *H01L23/3171* (2013.01); *H01L 23/3192* (2013.01); *H01L 23/5283* (2013.01); *H01L 23/53238* (2013.01); *H01L 24/03* (2013.01); *H01L 24/05* (2013.01); *H01L 24/45* (2013.01); *H01L 24/48* (2013.01); *H01L 2224/0347* (2013.01); *H01L 2224/04042* (2013.01); *H01L 2224/05083* (2013.01); *H01L 2224/05147* (2013.01); *H01L 2224/05556* (2013.01); *H01L 2224/05624* (2013.01); *H01L 2224/45144* (2013.01); *H01L 2224/48463* (2013.01); *H01L 2224/48624* (2013.01); *H01L 2924/01004* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01019* (2013.01); *H01L 2924/01022* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/04941* (2013.01); *H01L 2924/10253* (2013.01)

(56) References Cited

U.S. PATENT DOCUMENTS

| | | | |
|---|---|---|---|
| 6,656,828 | B1 | 12/2003 | Maitani et al. |
| 7,601,628 | B2 * | 10/2009 | Daubenspeck ...... B23K 1/0016 257/E21.508 |
| 7,843,069 | B2 * | 11/2010 | Daubenspeck ......... H01L 24/03 257/734 |
| 2001/0035452 | A1 | 11/2001 | Test et al. |
| 2002/0053746 | A1 * | 5/2002 | Stamper ................ H01L 23/522 257/781 |
| 2005/0106851 | A1 | 5/2005 | Test et al. |
| 2005/0191837 | A1 * | 9/2005 | Brintzinger ....... H01L 21/76885 438/613 |
| 2007/0275503 | A1 * | 11/2007 | Lin .......................... C25D 3/48 438/106 |
| 2008/0197511 | A1 * | 8/2008 | Lee .......................... H01L 24/03 257/782 |

FOREIGN PATENT DOCUMENTS

| | | |
|---|---|---|
| JP | 09-120963 A | 5/1997 |
| JP | 2001-319946 A | 11/2001 |
| JP | 2008-066450 A | 3/2008 |
| JP | 2008-091454 A | 4/2008 |
| WO | WO-0044043 A1 | 7/2000 |

\* cited by examiner

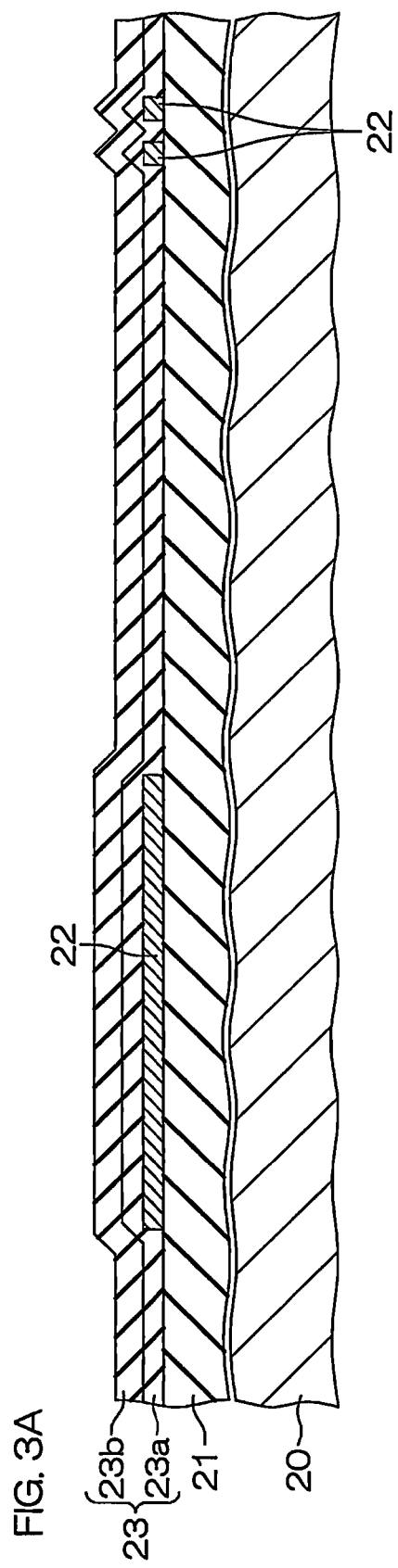

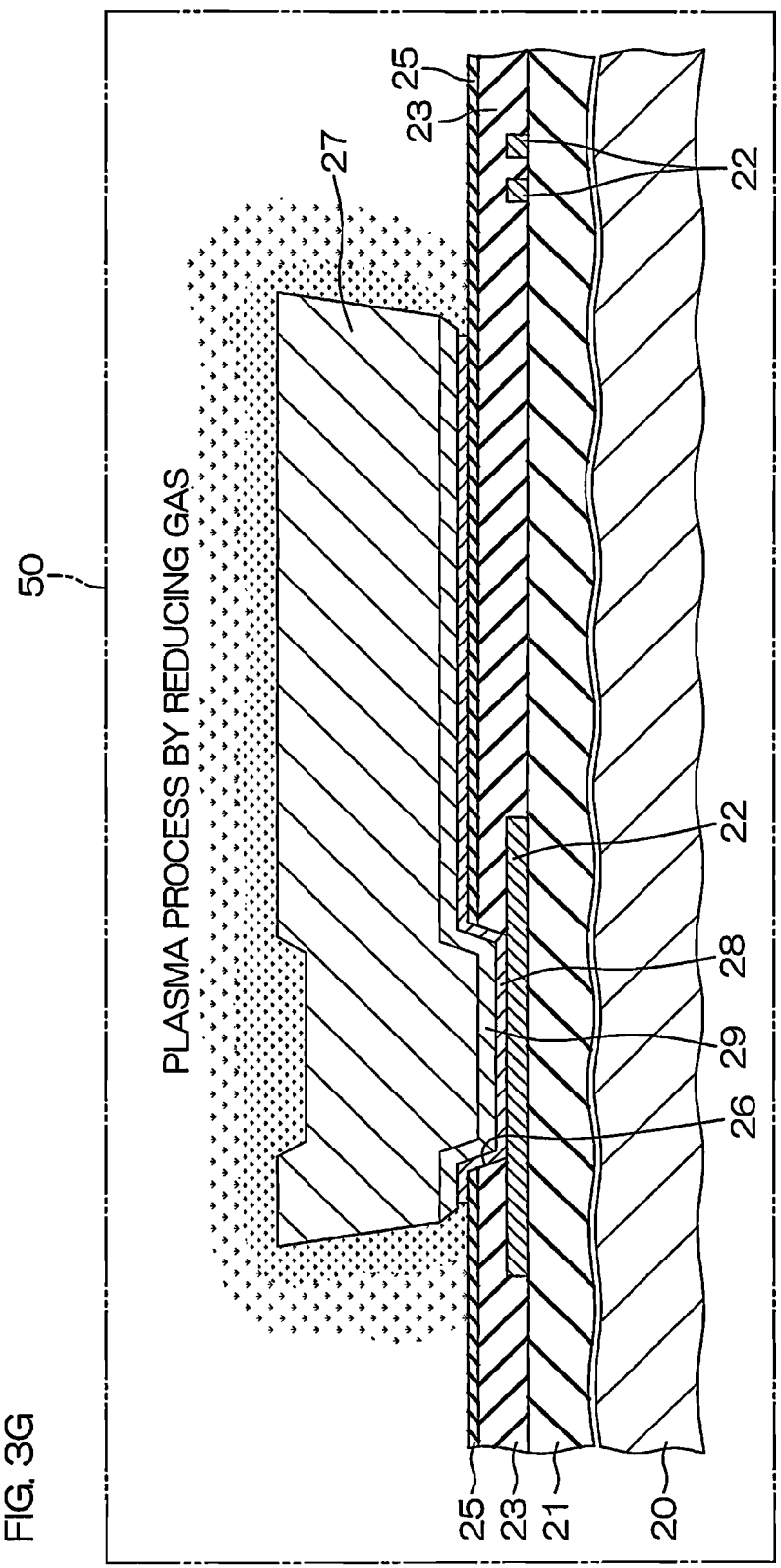

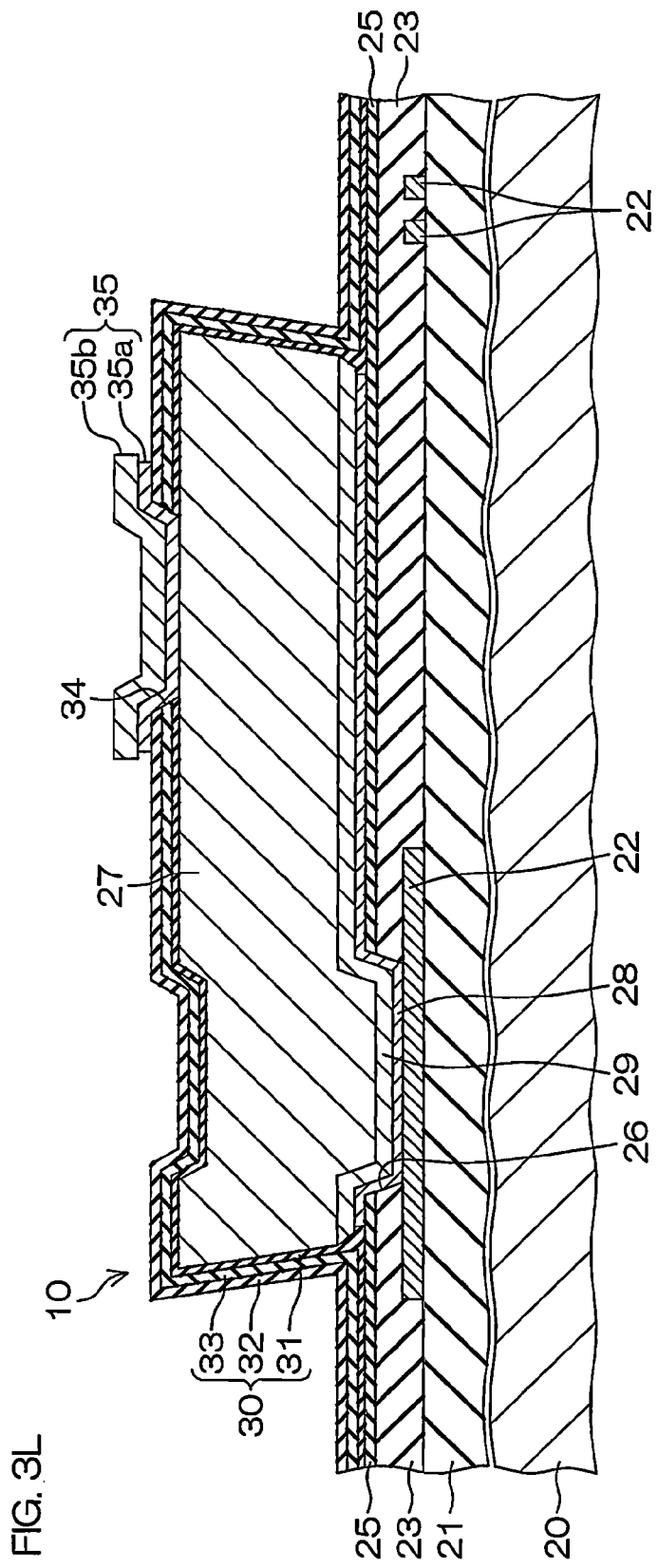

SEMICONDUCTOR DEVICE

TECHNICAL FIELD

The present invention relates to a semiconductor device having a wiring, made of a material having copper as a main component, on an interlayer insulating film and to a method of manufacturing the semiconductor device.

BACKGROUND ART

Although aluminum has been used conventionally as a wiring material of a semiconductor device, use of copper, which is a wiring material of higher conductivity, has been proposed for reduction in wiring resistance. For example, a structure using a copper wiring as an uppermost layer wiring is proposed in Non-Patent Document 1.

PRIOR ART DOCUMENT(S)

Patent Document(s)

Patent Document 1: Japanese Unexamined Patent Publication No. 2001-319946

Non-Patent Document(s)

Non-Patent Document 1: T. Efland et al, "Lead Frame On Chip Offers Integrated Power Bus and Bond over Active Circuit," Proceedings of 2001 International Symposium on Power Semiconductor Devices & ICs, Osaka, pp. 65-68.

SUMMARY OF THE INVENTION

Problem(s) to be Solved by the Invention

In a case where an uppermost layer wiring of a power device is to be made of a copper wiring, it is preferable to apply a thick-film copper wiring of 5 to 20 μm to reduce the electrical resistance adequately. The copper wiring must be covered by a passivation film made of an insulating material because copper oxidizes readily in air. A pad opening for exposing a portion of the copper wiring for external connection is formed in such a passivation film. The portion of the copper wiring surface exposed from the pad opening is called a pad. When a surface of the pad becomes oxidized, wire bonding becomes impossible, and thus a cap layer made of aluminum or other metal is formed on the pad surface.

As the passivation film covering the copper wiring, it is considered preferable to apply an organic film formed by coating of a polyimide or other resin material. This is so because a large step between the thick-film copper wiring and its periphery is filled. However, a problem is that a cost required for forming the organic film is high. Use of an inorganic film may thus be considered. A silicon oxide film, which is a typical example of an inorganic film, cannot be used as a film in contact with the copper wiring. This is because copper diffuses readily into silicon oxide. A silicon nitride film, which is another example of an inorganic film, may be used as a film in contact with the copper wiring because it can prevent the diffusion of copper.

As shown in FIG. 6, the present inventor performed an experiment of forming a silicon nitride film 2 so as to cover a thick-film copper wiring 1. Through microscopic observation of the prepared structure, it was found that a crack forms readily in the silicon nitride film 2 in a vicinity of a lower corner portion 4 at which the thick-film copper wiring 1 contacts an interlayer insulating film 3 that is an uppermost layer. This is considered to be due to concentration of stress in the silicon nitride film 2 in the vicinity of the lower corner portion 4. Although the problem of stress concentration is alleviated by reducing a film thickness of the silicon nitride film 2, a film thickness of no less than approximately 1 μm must be secured to prevent ingress of water.

It has been thus difficult to realize a passivation film capable of covering a copper wiring (especially a thick-film copper wiring) while avoiding the problem of crack formation due to stress concentration and yet achieving cost reduction using an inorganic material.

An object of the present invention is to provide a semiconductor device and a method for manufacturing the same by which the above problem is surmounted.

Means for Solving the Problem(s)

A semiconductor device according to the present invention includes an interlayer insulating film, a wiring formed on the interlayer insulating film so as to protrude therefrom and made of a material having copper as a main component, and a passivation film formed so as to cover the wiring. The passivation film is made of a laminated film in which a first nitride film, an intermediate film, and a second nitride film are laminated in that order from the wiring side. The intermediate film is made of an insulating material differing from those of the first and second nitride films.

With this arrangement, the passivation film is made of the laminated film in which the intermediate film is sandwiched by the first and second nitride films. The first nitride film is disposed at the side of the wiring (hereinafter referred to as "copper wiring") having copper as the main component, and diffusion of copper can thus be prevented by the first nitride film. The intermediate film relaxes stress in the first nitride film and further contributes to thickening of the passivation film. Further, the second nitride film is laminated on the intermediate film and can effectively prevent ingress of water and other foreign matter. The copper wiring can thus be protected by the passivation film which has an adequate thickness and yet with which cracking of the first nitride film is suppressed by the stress therein being relaxed by the intermediate film. The passivation film is made of an inorganic material and can thus be formed at low cost.

Even if the first nitride film is formed thinly, the passivation film, made of the laminated film, can be made to have an adequate film thickness as a whole. The first nitride film can thus be formed thinly to reduce the stress in the first nitride film further and crack formation in the first nitride film can thus be suppressed even further.

The copper wiring may be no less than 10 μm (for example, 10 μm to 20 μm) in thickness. By covering such a thick-film copper wiring by the passivation film, the thick-film copper wiring can be protected adequately while suppressing crack formation in the passivation film in a vicinity of a portion of contact of the thick-film copper wiring and the interlayer insulating film. Also, a width of the copper wiring may be no less than 10 μm (for example, 10 μm to 20 μm). For example, such a wide (and preferably thick) copper wiring may be a power supply wiring for a power device. The copper wiring may be an uppermost layer wiring.

Besides copper with a purity of no less than 99.9%, for example, a copper alloy having Al, Ti, Ag, etc., added may be used as the "material having copper as a main component" that forms the copper wiring.

The intermediate film is preferably a buffer film made of a material of lower stress than the material of the first nitride film. By this arrangement, the stress arising in the first nitride film can be relaxed effectively.

More specifically, the intermediate film may be an oxide film (a silicon oxide film or silicon oxynitride film, etc.). The diffusion of copper into the oxide film is prevented by the nitride film. An oxide film is low in stress in comparison to a nitride film and can thus relax stress arising in the first nitride film and thereby suppress crack formation in the first nitride film.

In a preferred embodiment according to the present invention, the semiconductor device further includes a barrier film formed on the interlayer insulating film and preventing the copper in the wiring from diffusing to the interlayer insulating film. Also, the wiring is formed on the barrier film and has an overhang portion extending outward from an edge portion of the barrier film. Such an overhang portion is unavoidably formed, for example, in a case where the barrier film is wet-etched using the copper wiring as a mask. When the first nitride film is formed, the first nitride film enters into a gap between the overhang portion and the interlayer insulating film. At the gap portion, the first nitride film attaches to the interlayer insulating film, a side wall of the barrier film, and a bottom surface of the copper wiring and consequently, a void may form in the first nitride film. When a large stress arises in the first nitride film, a crack tends to form readily with the void as a starting point. With the arrangement of the present invention, the crack formation can be suppressed because the stress in the first nitride film is relaxed by the intermediate film being laminated thereon.

Preferably, a film thickness of the first nitride film (inner film at the side closer to the copper wiring) is less than a film thickness of the second nitride film. By this arrangement, the stress in the first nitride film can be suppressed and the forming of a crack in the first nitride film can be suppressed more effectively.

The intermediate film may have a tapered portion that becomes narrower in width with distance away from the interlayer insulating film along a thickness direction of the wiring. By this arrangement, stress concentration in the first nitride film can be relaxed even more effectively because the intermediate film can be made thick at a peripheral edge of the portion of contact of the wiring and the interlayer insulating film. Crack formation can thereby be suppressed more effectively. Also, coverage of the intermediate film by the second nitride film is improved and the passivation film can thus be improved in protective performance.

The intermediate film having a tapered cross-sectional profile (contour) may be formed, for example, by a high-density plasma chemical vapor deposition (HDPCVD) method.

A method of manufacturing the semiconductor device according to the present invention includes a step of forming a wiring, made of a material having copper as a main component, on an interlayer insulating film so as to protrude therefrom, a step of applying a plasma process by a reducing gas to the wiring inside a processing chamber, a step of forming, inside the processing chamber after the plasma process, a first nitride film covering a surface (including a top surface and side surfaces) of the wiring and a surface (at least a surface of a region in a vicinity of the side surfaces of the wiring) of the interlayer insulating film by a plasma CVD method, a step of forming an intermediate film, made of a material differing from the first nitride film, so as to cover the first nitride film, and a step of forming a second nitride film, made of a material differing from the intermediate film, so as to cover the intermediate film.

By this method, the semiconductor device of the above-described arrangement can be prepared. Further, with this method, the plasma process by the reducing gas is applied to the copper wiring (wiring made of the material having copper as the main component) inside the processing chamber and thereafter the first nitride film is formed by the plasma CVD method performed inside the same processing chamber. The first nitride film is thereby formed in a state where an oxide film on the surface of the copper wiring is removed. Consequently, the first nitride film has a good adhesive property with respect to the copper wiring and film peeling of the first nitride film can thus be suppressed.

It may be considered that the oxide film on the copper wiring surface be removed in advance by wet etching outside the processing chamber before the forming of the first nitride film in the processing chamber for the plasma CVD method. However, in this case, an oxide film forms rapidly on the surface of the copper wiring when it is exposed to a high-temperature atmosphere inside the processing chamber. When the first nitride film is formed on such a surface on which the oxide film is formed, the first nitride film will not have an adequate adhesive property.

Preferably, the step of forming the intermediate film includes a step of forming a buffer film made of a material of lower stress than the material of the first nitride film. By this method, stress in the first nitride film can be relaxed effectively by the buffer film and crack formation in the first nitride film can be suppressed.

The step of forming the wiring may include a step of forming a barrier film on the interlayer insulating film, a step of forming a copper film of a predetermined wiring pattern on the barrier film, and a step of etching (for example, wet-etching) the barrier film to the wiring pattern. By etching (especially wet etching) of the barrier film, an overhang portion such as that described above is formed. As described above, cracking of the first nitride film can be suppressed effectively even in this case.

Preferably, the first and second nitride films are formed so that a film thickness of the first nitride film is less than a film thickness of the second nitride film. The stress in the first nitride film can thereby be reduced and crack formation in the first nitride film can thus be suppressed more effectively.

The step of forming the intermediate film may include a step of forming an oxide film by a high-density plasma CVD (high-density plasma chemical vapor deposition) method. In this case, the intermediate film is formed to have a cross-sectional profile with a tapered shape. The intermediate film is thereby made to be thick at a portion of contact of the copper wiring and the interlayer insulating film and the stress in the first nitride film can thus be reduced more effectively. In addition, coverage of the intermediate film by the second nitride film is improved and the passivation film can thus be improved in performance.

The above and yet other objects, characteristics, and effects of the present invention shall be made clear by the following description of preferred embodiments made in reference to the attached drawings.

BRIEF DESCRIPTION OF THE DRAWINGS

FIG. 3A is a schematic sectional view of a manufacturing step of the semiconductor device shown in FIG. 1 and FIG. 2.

FIG. 3G is a schematic sectional view of a step subsequent to that of FIG. 3F.

FIG. 3L is a schematic sectional view of a step subsequent to that of FIG. 3K.

MODE(S) FOR CARRYING OUT THE INVENTION

Figure 1:
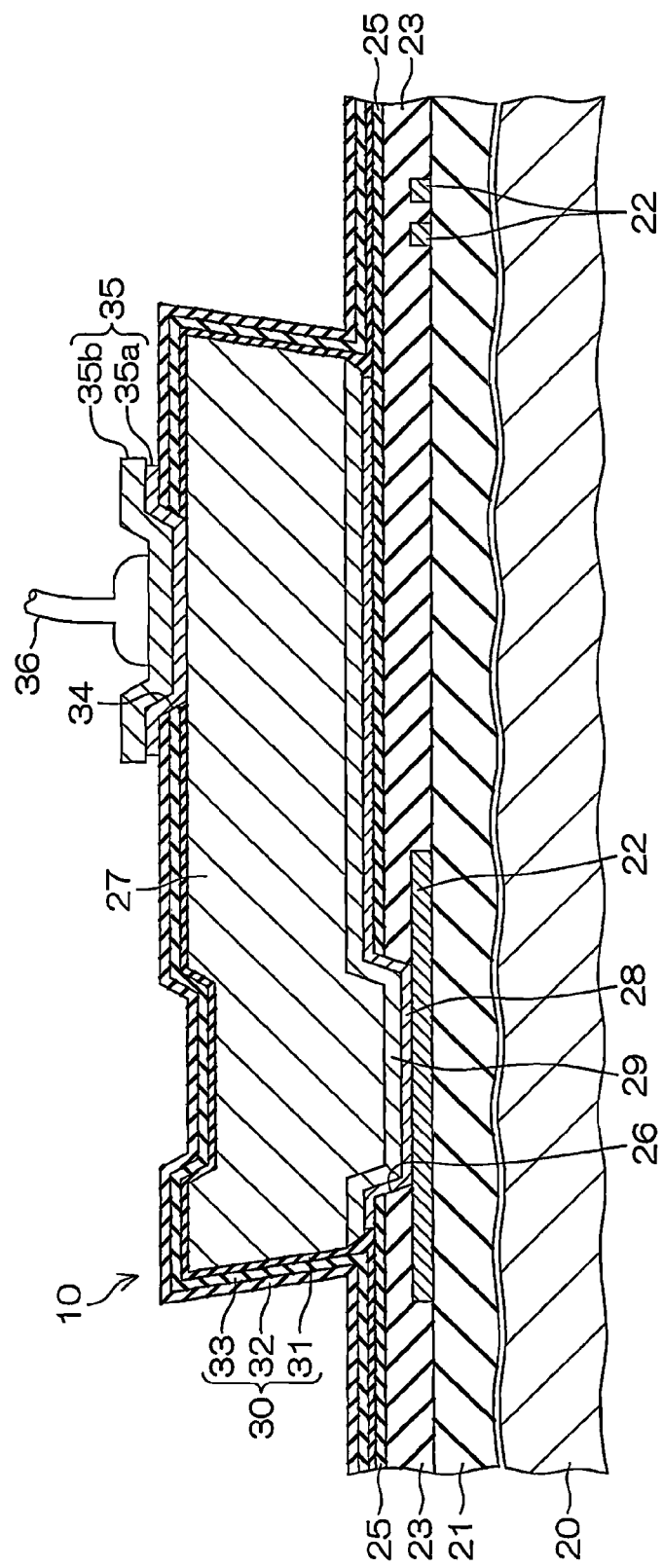
FIG. 1 is a sectional view of an arrangement of a semiconductor device according to a preferred embodiment of the present invention.

FIG. 1 is a sectional view of an arrangement of a semiconductor device according to a preferred embodiment of the present invention. The semiconductor device 10 includes a semiconductor substrate 20. The semiconductor substrate 20 is, for example, a Si (silicon) substrate. Functional elements such as a transistor (for example, a power transistor) are formed in the semiconductor substrates 20. A first interlayer insulating film 21 is laminated on the semiconductor substrate 20. The first interlayer insulating film 21 is made, for example, of $SiO_2$ (silicon oxide). A lower wiring 22 is formed on the first interlayer insulating film 21. The lower wiring 22 is made, for example, of aluminum or an aluminum alloy.

A second interlayer insulating film 23 is laminated on the first interlayer insulating film 21 and the lower wiring 22. The second interlayer insulating film 23 is made, for example, of $SiO_2$. A surface of the second interlayer insulating film 23 is flattened.

A third interlayer insulating film 25 is laminated on the second interlayer insulating film 23. The third interlayer insulating film 25 is made, for example, of SiN (silicon nitride).

A via hole 26 penetrating through the second interlayer insulating film 23 and the third interlayer insulating film 25 in a thickness direction is formed at portions of the films that face the lower wiring 22 in the thickness direction. The via hole 26 is formed to a tapered shape that increases in opening area toward the upper side.

An upper wiring 27 is formed as an uppermost layer wiring on the third interlayer insulating film 25.

The upper wiring 27 is formed on a region that includes the via hole 26 in a plan view and is formed to protrude upward from the third interlayer insulating film 25. The upper wiring 27 has, for example, a thickness such that a protrusion amount from a surface of the third interlayer insulating film 25 is no less than 2 μm (for example, 10 μm to 20 μm). A lower end portion of the upper wiring 27 enters inside the via hole 26 and is connected to the lower wiring 22. The upper wiring 27 is made of Cu (for example, Cu of a purity of 99.9%).

A barrier film 28 having a barrier property against diffusion of Cu ions and Au is interposed between the upper wiring 27 and the lower wiring 22, the second interlayer insulating film 23, and the third interlayer insulating film 25. The barrier film 28 is made, for example, of Ti (titanium) or TiW (titanium-tungsten alloy). The barrier film 28 can prevent diffusion of Cu (Cu ions) from the upper wiring 27 and thus prevents forming of a leak path between the upper wiring 27 and another uppermost layer wiring.

A passivation film 30 is formed on the third interlayer insulating film 25 and the upper wiring 27. The passivation film 30 is formed so as to cover a surface (a top surface and side surfaces) of the upper wiring 27. In the passivation film 30, a recess corresponding to the via hole 26 is formed at a position directly above the via hole 26. In a flat region shifted from the recess, a pad opening 34 that exposes a portion of the surface of the upper wiring 27 is formed penetratingly in a thickness direction of the passivation film 30. The portion of the upper wiring 27 exposed from the pad opening 34 is a pad. A cap metal layer 35 is formed so as to contact the pad. The cap metal layer 35 is formed in a region covering the pad opening 34, completely fills an interior of the pad opening 34, and contacts the upper wiring 27. The cap metal layer 35 is made, for example, of a laminated film of a barrier layer 35a and an adhesive layer 35b. The barrier layer 35a contacts the upper wiring 27 in the pad opening 34. The barrier layer 35a has a barrier property against diffusion of Cu ions and Au and is made, for example, of Ti (titanium) or TiW (titanium-tungsten). The adhesive layer 35b is made, for example, of aluminum or aluminum alloy.

One end portion of a bonding wire 36 made of Au is bonded to the cap metal layer 35. Another end portion of the bonding wire 36 is connected to an exterior of the semiconductor device 10. The bonding wire 36 is thereby electrically connected to the lower wiring 22 via the cap metal layer 35, the upper wiring 27, and the barrier film 28. The barrier layer 35a included in the cap metal layer 35 prevents Au in the bonding wire 36 from diffusing to the upper wiring 27 and prevents Cu in the upper wiring 27 from diffusing to the bonding wire 36. The adhesive layer 35b included in the cap metal layer 35 has a good adhesive property with respect to the barrier layer 35a and has an excellent adhesive property with respect to the bonding wire 36 made of Au.

The passivation film 30 is made of a laminated film in which a first nitride film 31, a second nitride film 32, and an intermediate film 33 are laminated. The first nitride film 31 that is the lowermost layer contacts the top surface and the side surfaces of the upper wiring 27 and contacts a surface of the third interlayer insulating film 25. The intermediate film 33 is sandwiched between the first nitride film 31 and the second nitride film 32. The second nitride film 32 that is the uppermost layer is exposed to the exterior and, at a peripheral edge portion of the pad opening 34, contacts the cap metal layer 35 from below (from the semiconductor substrate 20 side).

The first nitride film 31 and the second nitride film 32 are made, for example, of SiN (silicon nitride). The first nitride film 31 is preferably made 0.1 µm to 0.5 µm (for example, 0.5 µm) in film thickness. The second nitride film 32 is preferably made 0.8 µm to 2.0 µm (for example, 1.0 µm) in film thickness.

The intermediate film 33 is made, for example, of $SiO_2$ (silicon oxide) or other oxide film. The intermediate film 33 is preferably made 0.2 µm to 1.0 µm (for example, 0.5 µm) in film thickness. The intermediate film 33 is made of a material of lower stress than the material of the first nitride film 31 and the second nitride film 32. For example, whereas the stress in SiN is 0.2 GPa, the stress in $SiO_2$ is 0.1 GPa. Also, the film thickness of the intermediate film 33 is preferably set to a value adequate for relaxing the stress that arises in the first nitride film 31 in particular.

Figure 2:
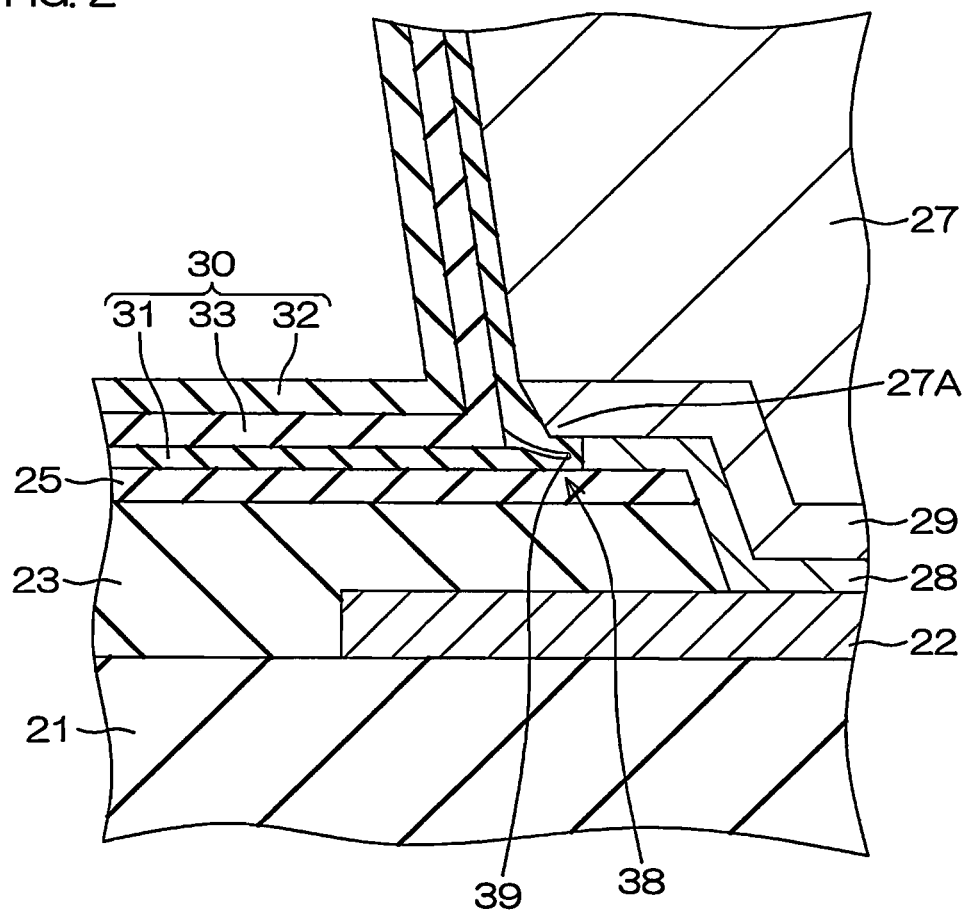
FIG. 2 is a partially enlarged sectional view showing a structure in a vicinity of a lower edge portion of an upper wiring (uppermost layer wiring) in enlarged manner.

FIG. 2 is a partially enlarged sectional view showing a structure in a vicinity of a lower edge portion of the upper wiring 27 in enlarged manner. The barrier film 28 is patterned by wet etching using the upper wiring 27 as a mask. The barrier film 28 is thus over-etched in a vicinity of an edge portion of the upper wiring 27. That is, an edge portion of the barrier film 28 is retreated further toward an inner side of a region below the upper wiring 27 than the lower edge portion of the upper wiring 27. That is, the upper wiring 27 has, in a vicinity of its lower edge portion, an overhang portion 27a extending outward from the edge portion of the barrier film 28. An over-etched region 38 with a C-shaped (sideways U-shaped) cross section is formed below the overhang portion 27a.

The first nitride film 31 of the passivation film 30 enters into the over-etched region 38 and contacts surfaces of the respective films that define the region 38. That is, the first nitride film 31 is attached to a surface of the third interlayer insulating film 25, a side wall surface of the barrier film 28, and a bottom surface of the upper wiring 27. Film-forming in such a complicated structural portion is difficult, and a void 39 may form inside the first nitride film 31. When a large stress arises in the first nitride film 31, a crack tends to form readily with the void 39 as a starting point. The intermediate film 33 is therefore laminated on the first nitride film 31 in the present preferred embodiment. The stress in the first nitride film 31 is thereby relaxed and crack formation can thus be suppressed. Further, the second nitride film 32 is laminated on the intermediate film 33 and the passivation film 30 exhibits an excellent surface protective performance as a whole. Also, the passivation film 30 is made of an inorganic material and can thus be formed at low cost.

FIGS. 3A to 3L are schematic sectional views of respective manufacturing steps of the semiconductor device shown in FIG. 1 and FIG. 2.

As shown in FIG. 3A, the first interlayer insulating film 21 is laminated by a CVD (chemical vapor deposition) method on a surface of the semiconductor substrate 20 with the functional elements such as a transistor built therein. Thereafter, an Al film that is to be the material of the lower wiring 22 is formed by a sputter method on the first interlayer insulating film 21. The lower wiring 22 is then formed by the Al film being patterned by photolithography and etching. An oxide film ($SiO_2$ film) 23a is then formed by an EDP (high density plasma) CVD method on the first interlayer insulating film 21 and the lower wiring 22. Thereafter, a USG (undoped silicate glass) film 23b is formed by a plasma CVD method on the oxide film 23a. The second interlayer insulating film 23 made of a laminated film of the oxide film 23a and the USG film 23b is thereby formed.

Figure 3B:
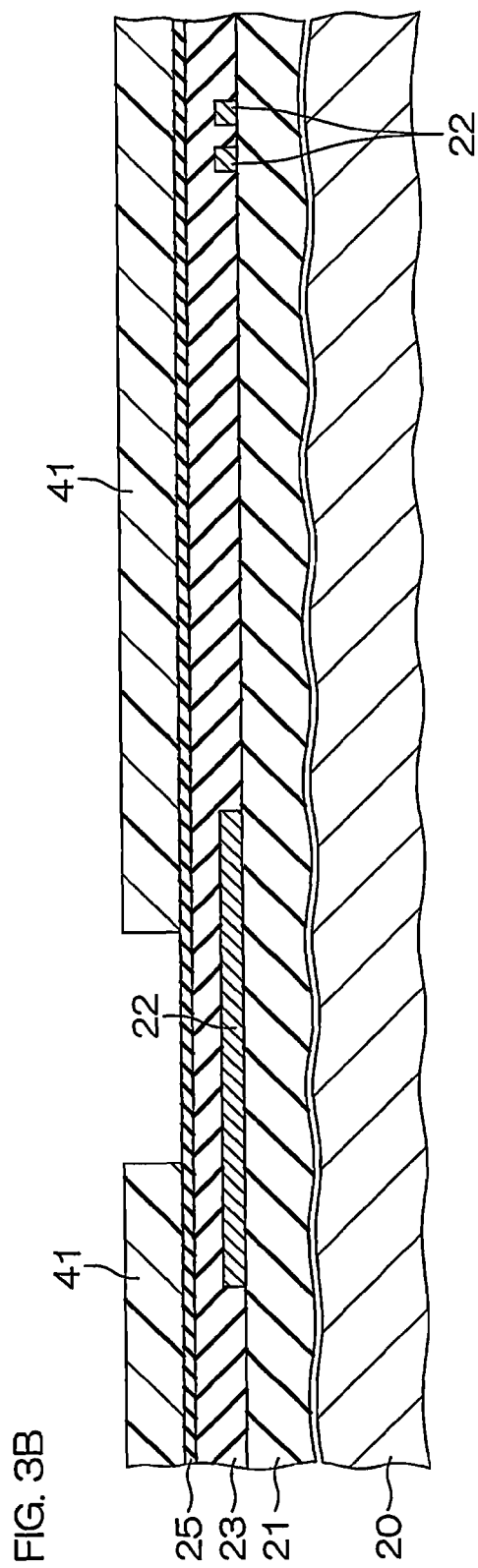
FIG. 3B is a schematic sectional view of a step subsequent to that of FIG. 3A.

Then, as shown in FIG. 3B, the second interlayer insulating film 23 is polished from its surface by a CMP (chemical mechanical polishing) method. The polishing of the second interlayer insulating film 23 is executed so that the film thickness of the second interlayer insulating film 23 becomes a predetermined target value (for example, 9500 Å). The surface of the second interlayer insulating film 23 is thereby flattened. Thereafter, the third interlayer insulating film 25 is formed by the plasma CVD method on the second interlayer insulating film 23. Thereafter, a resist mask 41 with a pattern having an opening on the lower wiring 22 is formed on the third interlayer insulating film 25.

Figure 3C:
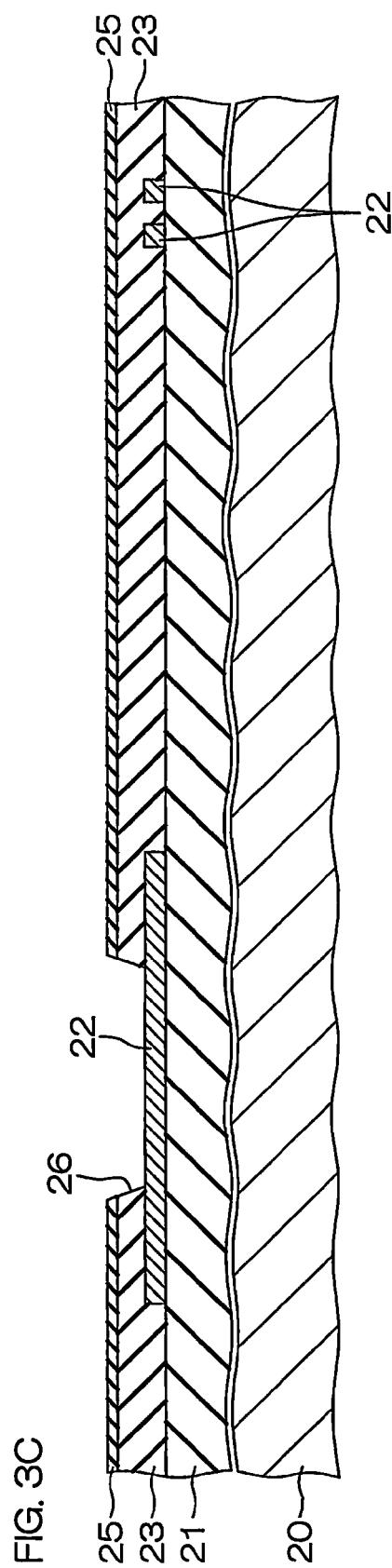
FIG. 3C is a schematic sectional view of a step subsequent to that of FIG. 3B.

Then, as shown in FIG. 3C, the third interlayer insulating film 25 and the second interlayer insulating film 23 are selectively removed by dry etching (for example, RIE: reactive ion etching) using the resist mask 41 as a mask and the via hole 26 penetrating through the films in the thickness direction is thereby formed.

Figure 3D:
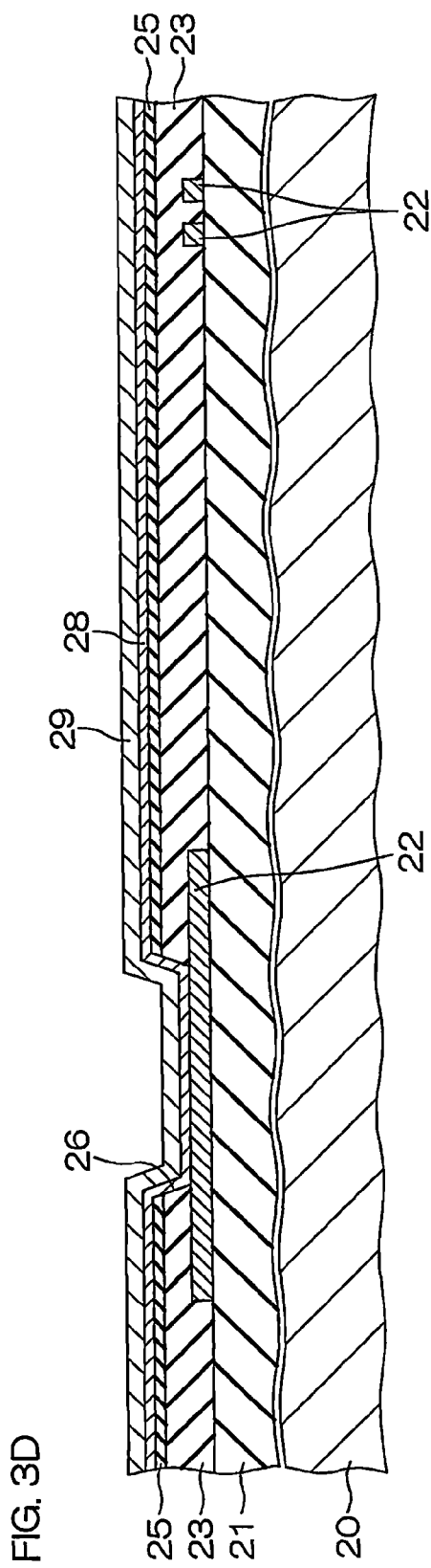
FIG. 3D is a schematic sectional view of a step subsequent to that of FIG. 3C.

Then, as shown in FIG. 3D, a barrier film 28, made for example of TiW, is formed by the sputter method on an inner surface (bottom surface and side wall) of the via hole 26 and on the third interlayer insulating film 25. Next, a seed film 29 made of Cu is formed by the sputter method on the barrier film 28.

Figure 3E:
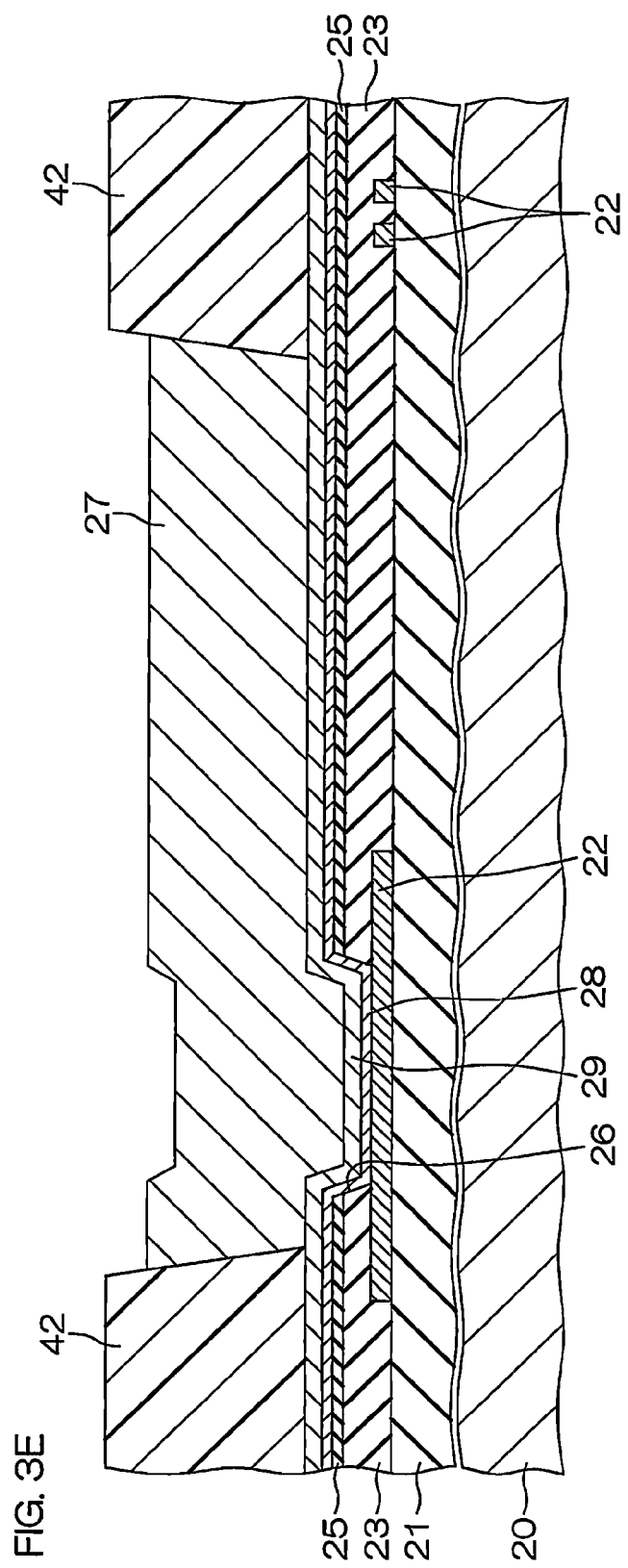
FIG. 3E is a schematic sectional view of a step subsequent to that of FIG. 3D.

Thereafter, as shown in FIG. 3E, a resist pattern 42 having an opening at a portion facing a region that includes the via hole 26 in a plan view is formed on the barrier film 28 and the seed film 29. The opening of the resist pattern 42 is formed in a pattern corresponding to a wiring pattern of the upper wiring 27. Cu is then grown by plating inside the opening of the resist pattern 42. The interior of the opening of the resist pattern 42 is thereby completely filled with Cu and the upper wiring 27 of the predetermined wiring pattern made of Cu is formed. After the forming of the upper wiring 27, the resist pattern 42 is removed. The upper wiring 27 has, for example, a film thickness of approximately 10 µm and a width of approximately 10 µm. That is, the upper wiring 27 is formed in a state of protruding by approximately 10 µm from the third interlayer insulating film 25.

Figure 3F:
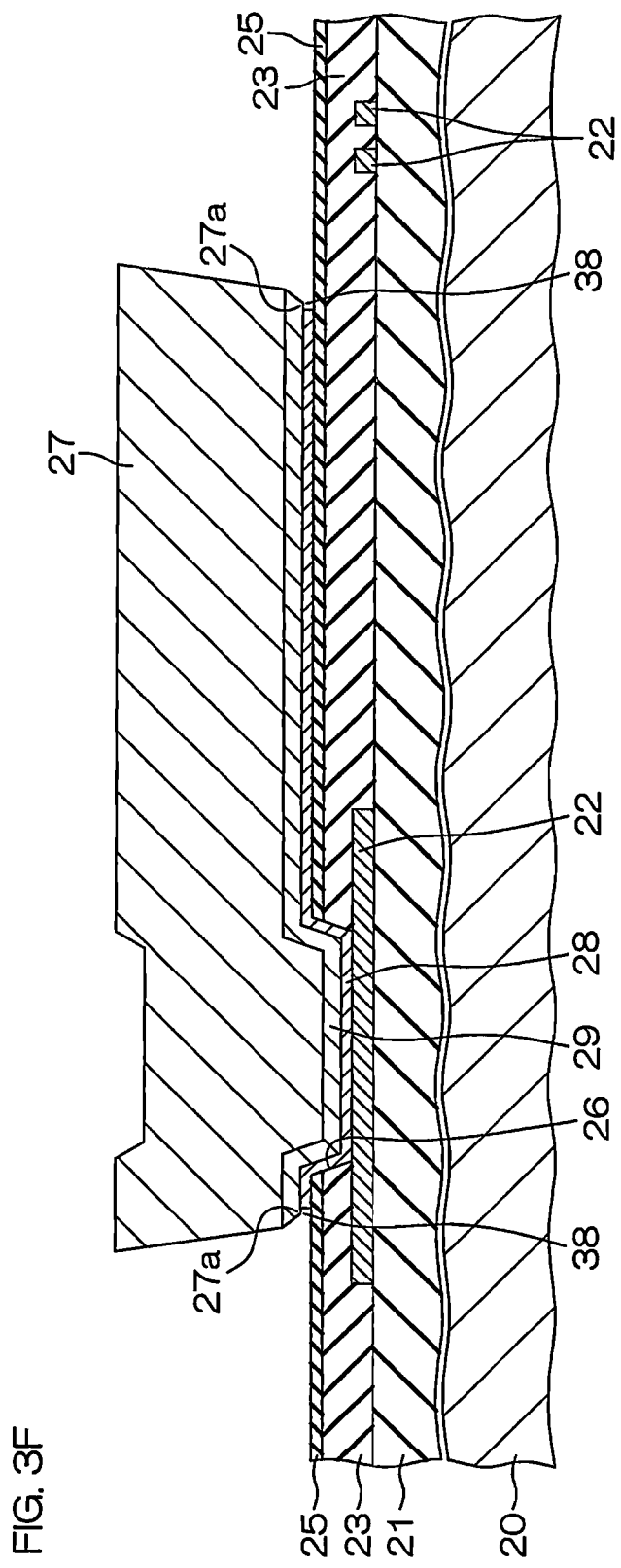
FIG. 3F is a schematic sectional view of a step subsequent to that of FIG. 3E.

Thereafter, as shown in FIG. 3F, the seed film 29 and the barrier film 28 are etched successively by wet etching using the upper wiring 27 as a mask. The portions of the seed film 29 and the barrier film 28 that were formed below the resist pattern 42 are thereby removed. The seed film 29 and the barrier film 28 are thereby etched to a wiring pattern matching the upper wiring 27. In the process of wet etching, the overhang portion 27a and the over-etched region 38 are formed by occurrence of over-etching of the barrier film 28.

Then, as shown in FIG. 3G, the substrate 20 is carried into a processing chamber 50 of a plasma CVD apparatus and inside the processing chamber 50, a plasma process by a reducing gas is applied to the upper wiring 27. A reducing gas is a gas with a property of reducing and thereby removing an oxide on the surface of the upper wiring 27. As examples of such a reducing gas, $H_2$ (hydrogen) gas and $NH_3$ (ammonia) gas can be cited. An $NH_3/H_2$ mixed gas may also be used as the reducing gas. Such a reducing gas is supplied to the processing chamber 50 and a plasma of the reducing gas is formed inside the processing chamber 50. The oxide film on the surface of the upper wiring 27 is removed by the plasma process by such a reducing gas.

Figure 3H:
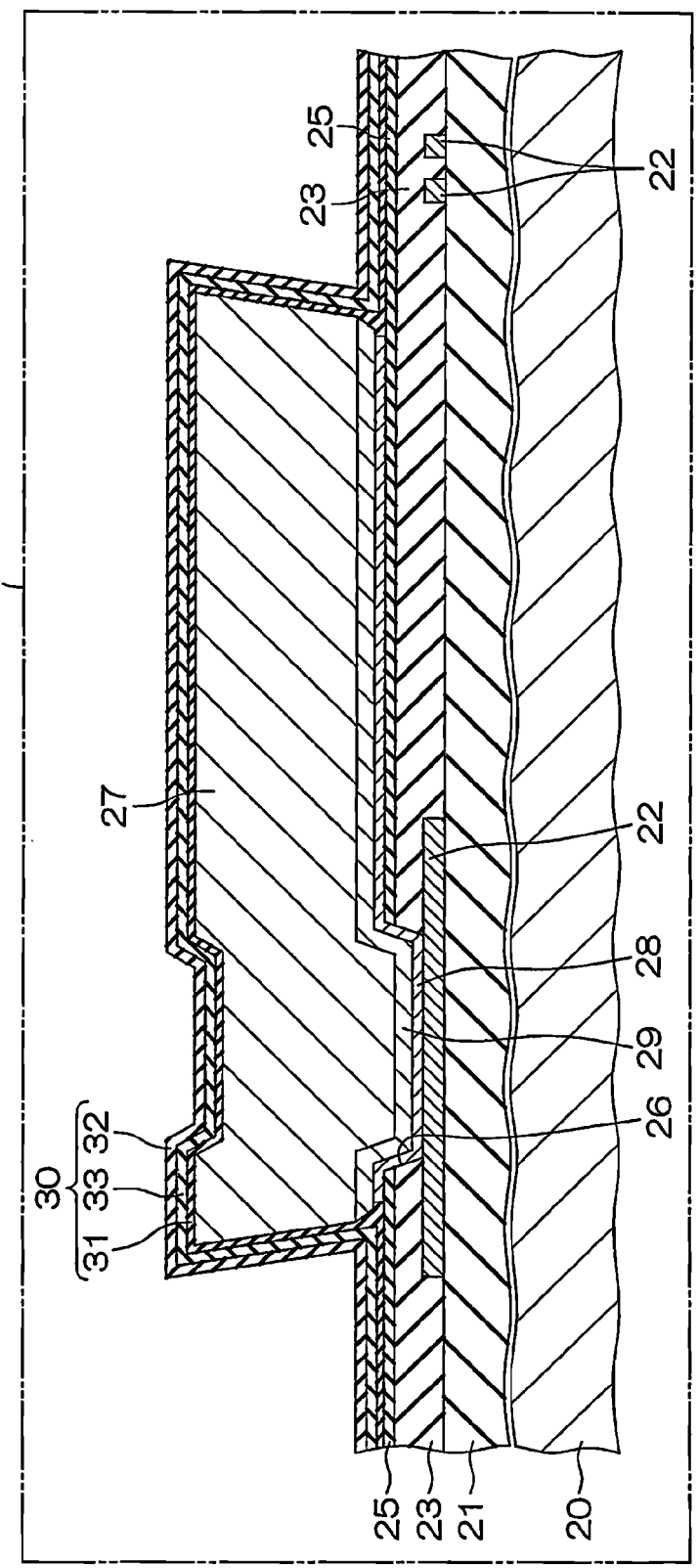
FIG. 3H is a schematic sectional view of a step subsequent to that of FIG. 3G.

Then, as shown in FIG. 3H, the passivation film 30 is formed by the plasma CVD method inside the same processing chamber 50. Specifically, the first nitride film 31 is formed, the intermediate film 33 is thereafter formed on the first nitride film 31, and the second nitride film 32 is thereafter formed on the intermediate film 33. The first nitride film 31 and the second nitride film 32 are formed by the plasma CVD method performed upon supplying, for example, $SiH_4$ (silane), $N_2$ (nitrogen), and $NH_3$ (ammonia) as raw material gases to the processing chamber 50. SiN films are thereby formed. Also, the intermediate film 33 is formed by the plasma CVD method performed upon supplying, for example, $SiH_4$ (silane), $N_2O$ (nitrous oxide), and $O_2$ (oxygen) as raw material gases to the processing chamber 50. An $SiO_2$ film is thereby formed. A substrate temperature is set, for example, to 300° C. to 400° C. during film forming.

The first nitride film 31 adheres satisfactorily to the upper wiring 27 because the plasma process by the reducing gas is performed inside the same processing chamber 50 immediately before the forming of the passivation film 30. The first nitride film 31 is formed so as to cover the top surface and the side surfaces of the upper wiring 27 and the surface of the third interlayer insulating film 25. The first nitride film 31 covers the third interlayer insulating film 25 at least in a region in a vicinity of the side surfaces of the upper wiring 27. The intermediate film 33 is formed so as to cover the first nitride film 31. The second nitride film 32 is formed so as to cover the intermediate film 33.

Figure 3I:
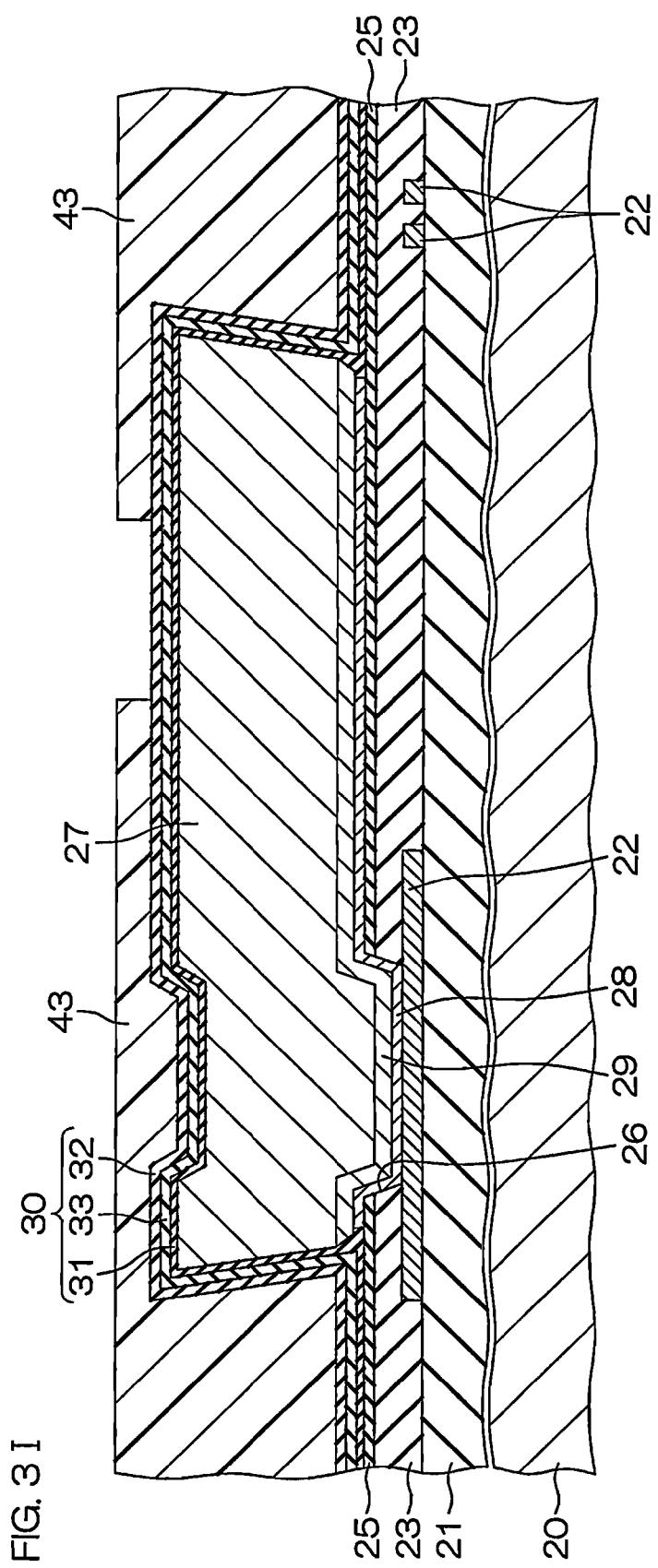
FIG. 3I is a schematic sectional view of a step subsequent to that of FIG. 3H.
Figure 3J:
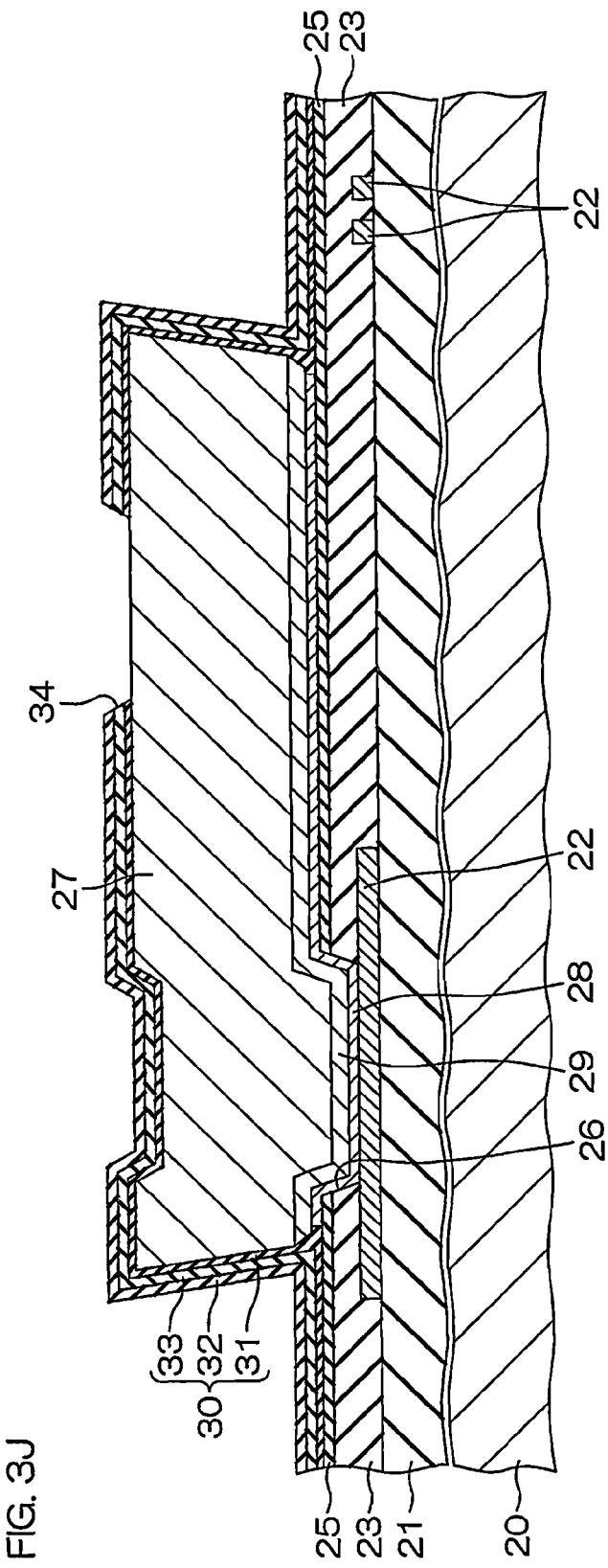
FIG. 3J is a schematic sectional view of a step subsequent to that of FIG. 3I.

Then, as shown in FIG. 3I, a resist mask 43 having an opening corresponding to the pad opening 34 is formed. By dry etching (for example, RIE) using the resist mask 43 as a mask, the pad opening 34 is formed in the passivation film 30 and a portion of the upper wiring 27 is exposed. The resist mask 43 is peeled off thereafter, and a state shown in FIG. 3J is attained.

Figure 3K:
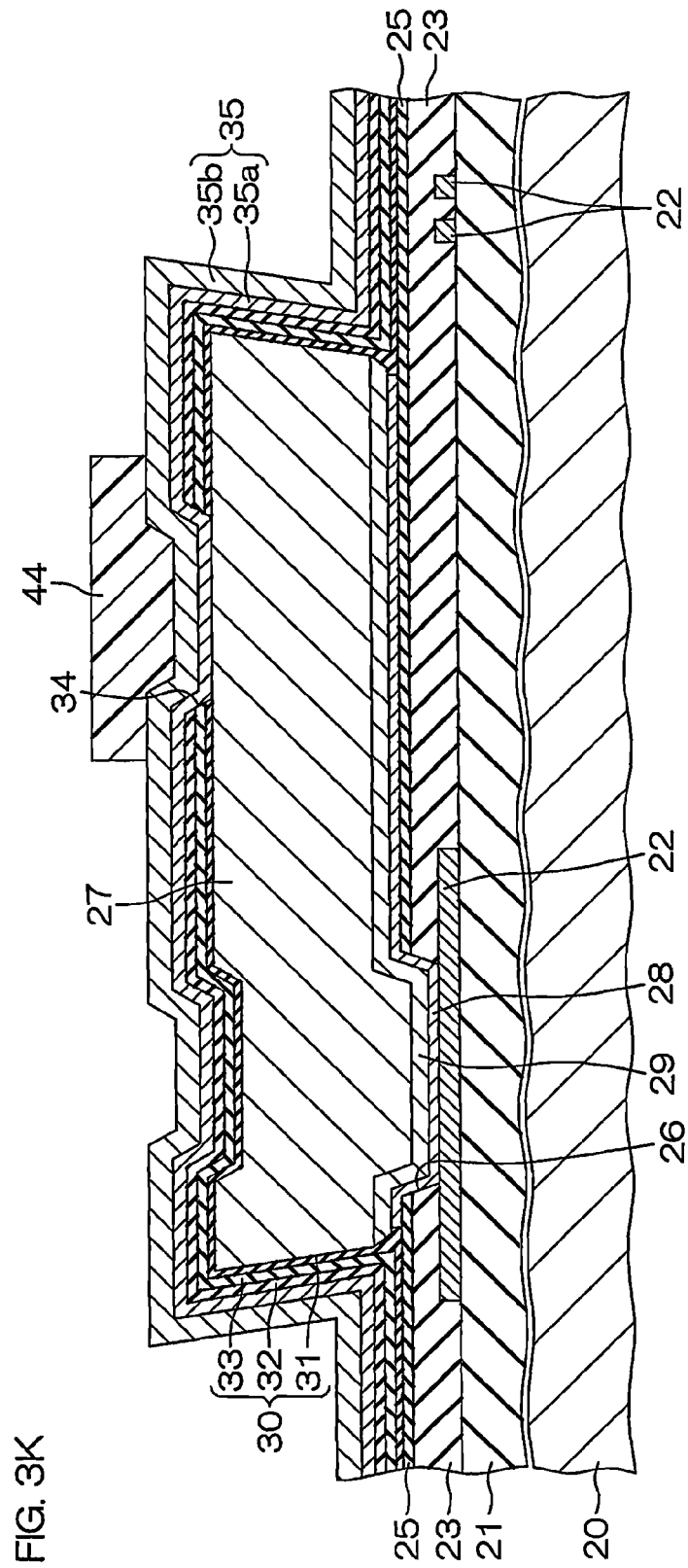
FIG. 3K is a schematic sectional view of a step subsequent to that of FIG. 3J.

Thereafter, as shown in FIG. 3K, the barrier layer 35a and the adhesive layer 35b are formed in that order on the third interlayer insulating film 25 and the upper wiring 27. A resist mask 44 corresponding to the cap metal layer 35 is then formed above the pad opening 34. The barrier layer 35a is made, for example, of a TiW film with a film thickness of 500 Å. The adhesive layer 35b is made, for example, of an Al film with a film thickness of 1000 Å.

Then, as shown in FIG. 3L, the adhesive layer 35b is patterned by dry etching (for example, RIE) using the resist mask 44 as a mask. Further, the barrier layer 35a is patterned by wet etching using the patterned adhesive layer 35b as a mask. The cap metal layer 35 covering the pad opening 34 is thereby formed. By the one end portion of the bonding wire 36 thereafter being bonded to the cap metal layer 35, the semiconductor device 10 shown in FIG. 1 is obtained.

Figure 4A:
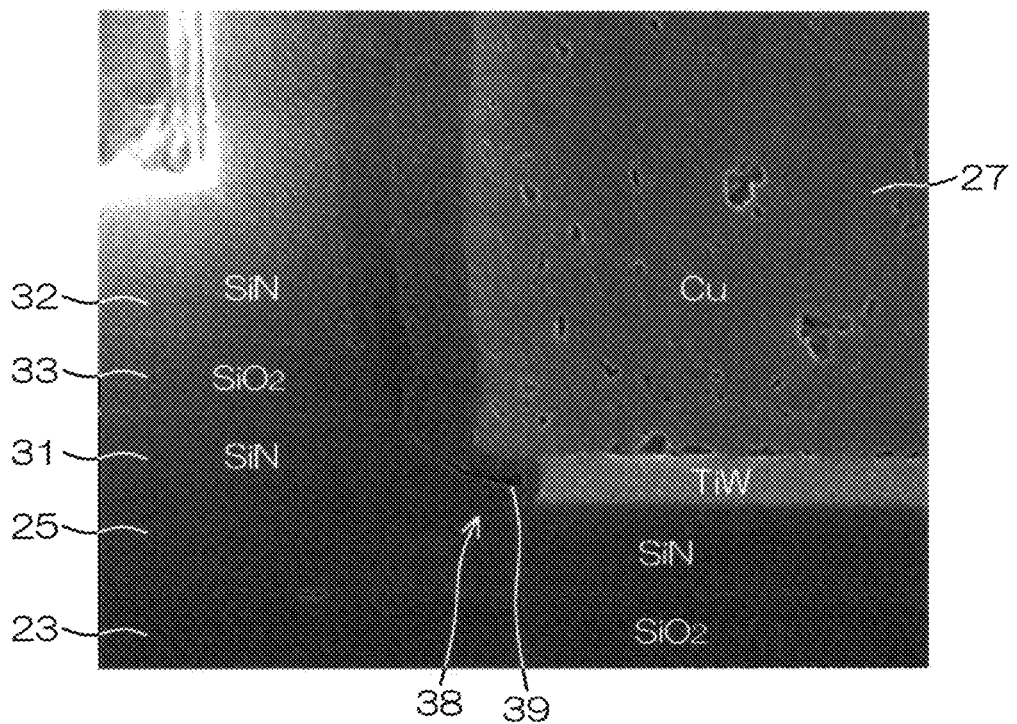
FIG. 4A is an electron micrograph of a semiconductor device (example) prepared in accordance with the preferred embodiment.

FIG. 4A is an electron micrograph of a semiconductor device prepared in accordance with the preferred embodiment and shows a lower edge portion of the upper wiring 27. The first nitride film 31 is made of SiN and has a film thickness of 0.5 μm. The intermediate film 33 is made of $SiO_2$ and has a film thickness of 0.5 μm. The second nitride film 32 is made of SiN and has a film thickness of 1.0 μm. Although the void 39 is formed in the first nitride film 31 in a vicinity of the over-etched region 38, a crack or other defect is not formed in any of the first nitride film 31, second nitride film 32, and intermediate film 33. The passivation film 30 thus exhibits a satisfactory protective performance as a whole.

Figure 4B:
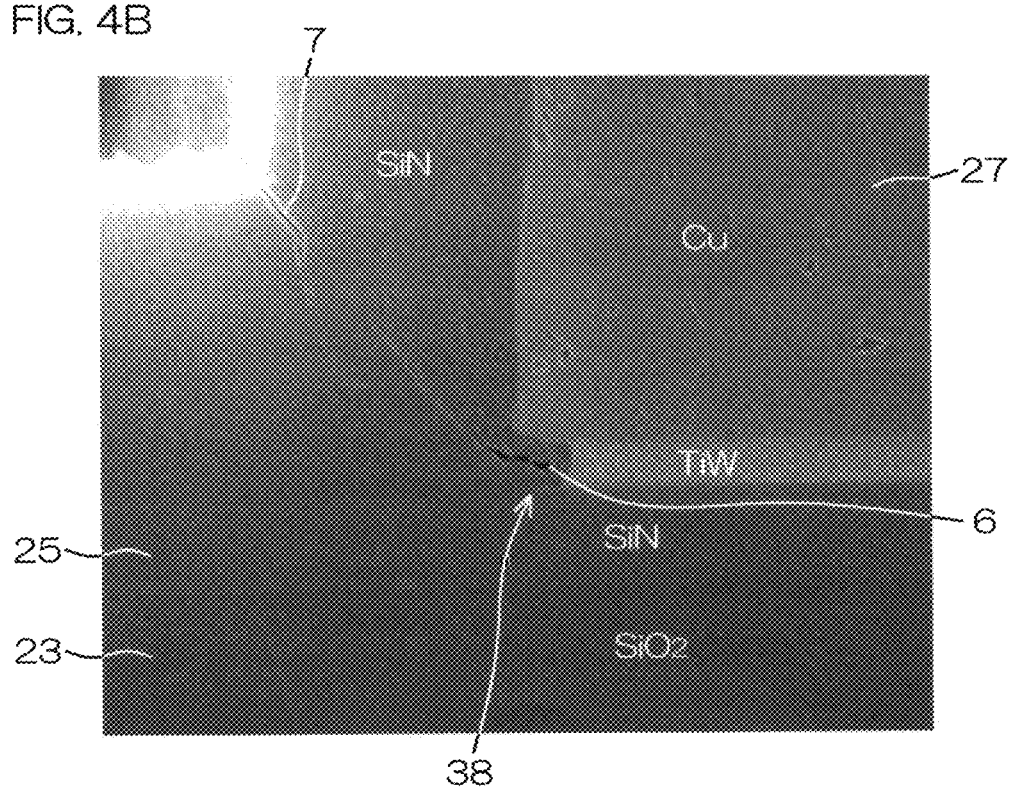
FIG. 4B is an electron micrograph of a comparative example in which a passivation film is formed of a single SiN layer having a film thickness of 2 μm.

FIG. 4B is an electron micrograph of a comparative example in which a passivation film 5 is formed of a single SiN layer with a film thickness of 2 μm. In the passivation film 5, a crack 7 is formed due to avoid 6 formed in a vicinity of the over-etched region 38. There is thus apprehension of ingress of water, etc., from the exterior and the protective performance is not adequate.

As described above, with the semiconductor device 10 of the present preferred embodiment, the passivation film 30, which covers the upper wiring 27 (uppermost layer wiring) formed on the surface of the third interlayer insulating film 25 so as to protrude therefrom, is made of the laminated film in which the intermediate film 33 is sandwiched between the first nitride film 31 and the second nitride film 32. The intermediate film 33 is made of the oxide film that is a material differing from the first nitride film 31 and is of lower stress than the nitride film. The intermediate film 33 thus functions as a buffer film that relaxes the stress in the first nitride film 31, and the passivation film 30, which has an adequate film thickness as a whole and with which cracking of the first nitride film 31 is suppressed, can thus be realized. The upper wiring 27 made of Cu can thereby be protected. Also, the diffusion of copper from the upper wiring 27 can be prevented because the first nitride film 31 without any cracks is in contact with the upper wiring 27.

Even if the first nitride film 31 is formed thinly, the passivation film 30 has an adequate film thickness as a whole. The first nitride film 31 can thus be made thin to reduce the stress in the first nitride film 31 further. In particular, by making the film thickness of the first nitride film 31 less than the film thickness of the second nitride film 32, the protective performance of the passivation film 30 can be enhanced by the second nitride film 32 of large film thickness while reducing the stress in the first nitride film 31.

Further, in the manufacturing method, after growing the upper wiring 27 by plating, the plasma process by the reducing gas is performed inside the processing chamber 50 and thereafter, the first nitride film 31 is formed by the plasma CVD method inside the same processing chamber 50. The oxide film on the surface of the upper wiring 27 is thereby removed immediately before the forming of the first nitride film 31 and the first nitride film 31 thus has an excellent adhesive property with respect to the upper wiring 27. Peeling of the passivation film 30 can thereby be prevented and the semiconductor device 10 of high reliability can thus be provided.

Figure 5:
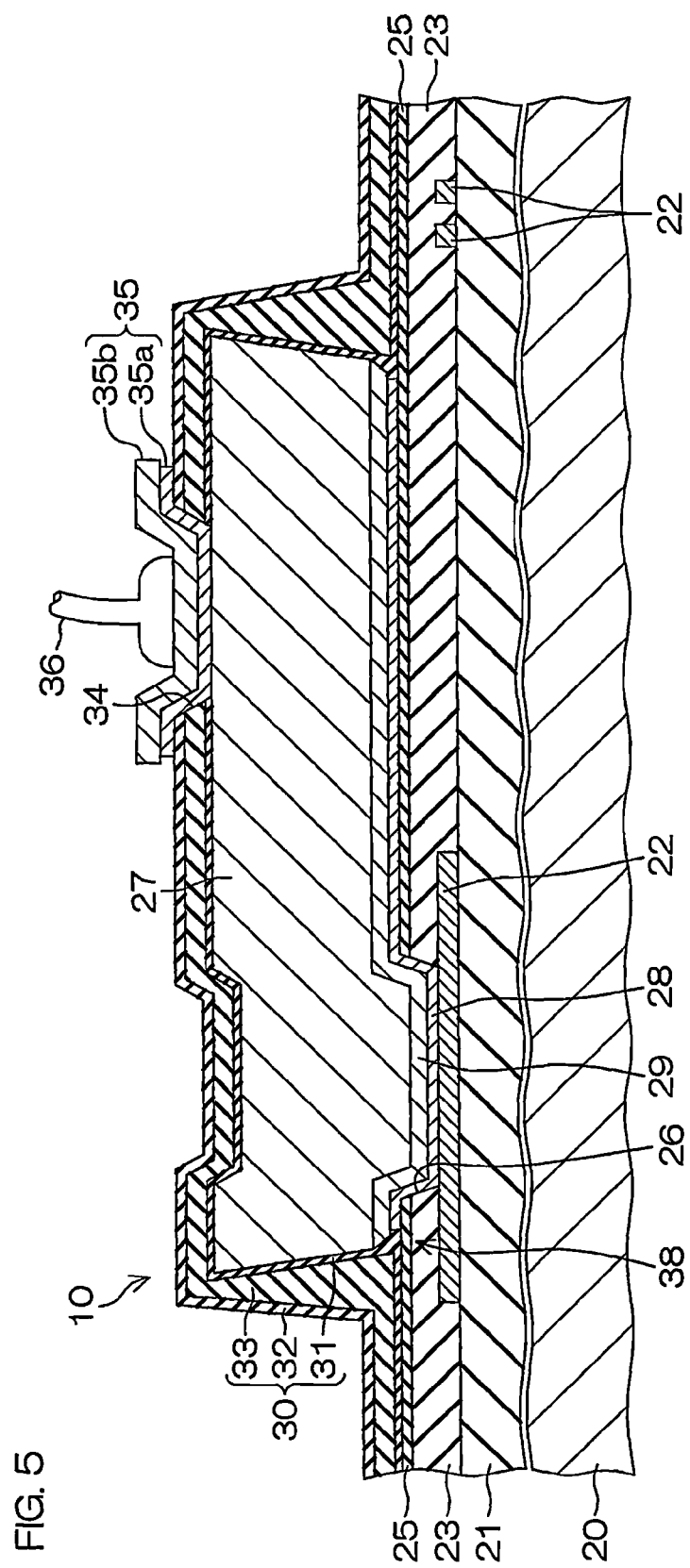
FIG. 5 is a sectional view of an arrangement of a semiconductor device according to another preferred embodiment of the present invention.
Figure 6:
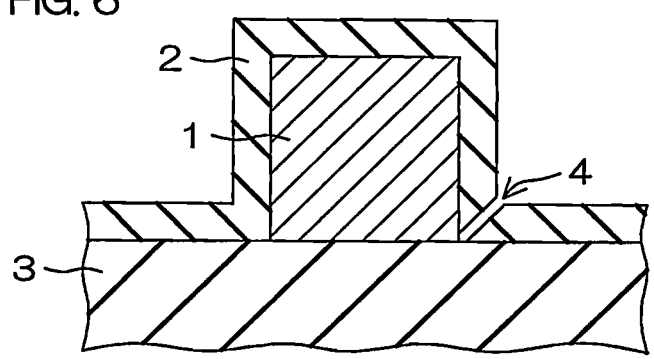
FIG. 6 is a sectional view of an arrangement of a trial manufacturing example (comparative example) in which a thick-film copper wiring is covered by a single silicon nitride film.

FIG. 5 is a sectional view of an arrangement of a semiconductor device according to another preferred embodiment of the present invention. In the present preferred embodiment, the intermediate film 33 of the passivation film 30 has a cross-sectional profile (contour) with a tapered shape that becomes narrower in width toward the upper side (in a direction away from the semiconductor substrate 20). The film thickness of the intermediate film 33 can thus be made thick at a peripheral edge of the portion of contact of the upper wiring 27 and the third interlayer insulating film 25. Concentration of stress in the first nitride film 31 can thus be relaxed even more effectively in the vicinity of the over-etched region 38. Crack formation in the first nitride film 31 can thereby be suppressed more effectively. Also, a surface shape of the intermediate film 33 exhibits a gradual change in a vicinity of an upper corner portion of the upper wiring 27. For example, the surface of the intermediate film 33 has, in its cross section, a contour of trapezoidal shape with which a long edge and a side edge form an obtuse angle. The second nitride film 32 formed on the intermediate film 33 is thereby made to adhere closely to the intermediate film 33 with satisfactory coverage (covering property). Consequently, the protective performance of the passivation film 30 can be improved further.

The intermediate film 33 may be formed, for example, by a high-density plasma chemical vapor deposition (HDP-CVD) method. More specifically, in the step of FIG. 3H (step of forming the passivation film), after forming the first nitride film 31 by the plasma CVD method, the intermediate film 33 is formed by the HDPCVD method and thereafter the second nitride film 32 is formed by the plasma CVD method. The intermediate film 33 is thereby made to have the profile of trapezoidal cross-sectional shape.

Although two preferred embodiments according to the present invention have been described above, the present invention may be carried out in yet other modes. For example, although cases where the intermediate film 33 of the passivation film 30 is made of SiO$_2$ have been described with the preferred embodiments, the intermediate film 33 may be made of SiON (silicon oxynitride) instead.

Further, although SiN has been indicated as an example of the material of the third interlayer insulating film 25 in the preferred embodiments, SiO$_2$ may be used instead. However, Cu ions diffuse more readily inside SiO$_2$ than inside SiN and thus by using SiN as the material of the third interlayer insulating film 25, the diffusion of Cu ions can be prevented more satisfactorily.

Further, although Ti and TiW have been indicated as examples of the materials of the barrier film 28 and the barrier layer 35a, the barrier film 28 and the barrier layer 35a may be formed of other materials having conductivity and having a barrier property against the diffusion of Cu ions and Au. Besides Ti and TiW, TiN (titanium nitride), WN (tungsten nitride), TaN (tantalum nitride), Ta (tantalum), W (tungsten), etc., can be given as examples of such materials.

Also, although Al has been indicated as the material of the adhesive layer 35b of the cap metal layer 35, a metal material of high adhesive property with respect to Cu and an insulating material can be used as the material, and besides Al, for example, AlSiCu (silicon compound of aluminum-copper alloy) or AlCu (aluminum-copper alloy), etc., may be applied.

Although the preferred embodiments of the present invention have been described in detail, these preferred embodiments are merely specific examples used to clarify the technical contents of the present invention, and the present invention should not be understood as being limited to these specific examples, and the spirit and scope of the present invention are limited solely by the appended claims.

The present application corresponds to Japanese Patent Application No. 2010-085193 filed in the Japan Patent Office on Apr. 1, 2010 and the entire disclosure of this application is incorporated herein by reference.

DESCRIPTION OF SYMBOLS

10 Semiconductor device
20 Semiconductor substrate
21 First interlayer insulating film
22 Lower wiring
23 Second interlayer insulating film
25 Third interlayer insulating film
27 Upper wiring
27a Overhang portion
28 Barrier film
29 Seed film
30 Passivation film
31 First nitride film
32 Second nitride film
33 Intermediate film
34 Pad opening
35 Cap metal layer
36 Bonding wire
38 Over-etched region
39 Void
50 Processing chamber

What is claimed is:

1. A semiconductor device, comprising:
an interlayer insulating film;
a wiring formed on the interlayer insulating film so as to protrude there from and made of a material having copper as a main component, the wiring having a thickness direction and having a cross sectional shape of an inverted trapezoid that becomes wider in width with distance away from the interlayer insulating film along the thickness direction of the wiring; and
a passivation film formed so as to cover the wiring,
wherein the passivation film is made of a laminated film in which a first nitride film, an intermediate film, and a second nitride film are laminated in that order from the wiring side, the intermediate film is made of an insulating material differing from those of the first and second nitride films, and the intermediate film has a tapered portion having a cross sectional shape of a trapezoid that becomes narrower in width with distance away from the interlayer insulating film along the thickness direction of the wiring.

2. The semiconductor device according to claim 1, wherein the intermediate film is a buffer film made of a material of lower stress than that of the first nitride film.

3. The semiconductor device according to claim 1, further comprising a barrier film formed on the interlayer insulating film and preventing the copper in the wiring from diffusing to the interlayer insulating film,
wherein the wiring is formed on the barrier film and has an overhang portion extending outward from an edge portion of the barrier film.

4. The semiconductor device according claim 1, wherein the first nitride film has a film thickness that is less than that of the second nitride film.

5. The semiconductor device according to claim 2, further comprising a barrier film formed on the interlayer insulating film and preventing the copper in the wiring from diffusing to the interlayer insulating film,
wherein the wiring is formed on the barrier film and has an overhang portion extending outward from an edge portion of the barrier film.

6. The semiconductor device according claim 2, wherein the first nitride film has a film thickness that is less than that of the second nitride film.

7. The semiconductor device according to claim 3, wherein the first nitride film has a film thickness that is less than that of the second nitride film.

8. The semiconductor device according to claim 5, wherein the first nitride film has a film thickness that is less than that of the second nitride film.

* * * * *